United States Patent
Iwai

(10) Patent No.: US 8,174,866 B2
(45) Date of Patent: May 8, 2012

(54) SEMICONDUCTOR STORAGE DEVICE

(75) Inventor: Takayuki Iwai, Setagaya-ku (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 241 days.

(21) Appl. No.: 12/723,851

(22) Filed: Mar. 15, 2010

(65) Prior Publication Data

US 2011/0058407 A1  Mar. 10, 2011

(30) Foreign Application Priority Data

Sep. 8, 2009 (JP) ................................. 2009-207218

(51) Int. Cl.
 *G11C 11/24* (2006.01)
(52) U.S. Cl. .......................... 365/149; 365/222; 365/229
(58) Field of Classification Search .................. 365/149, 365/222, 229
See application file for complete search history.

(56) References Cited

U.S. PATENT DOCUMENTS

| 2003/0063512 A1* | 4/2003 | Takahashi et al. | ............ 365/222 |
| 2007/0133326 A1* | 6/2007 | Ishikura et al. | ............... 365/201 |
| 2009/0201745 A1* | 8/2009 | Ishikura et al. | .......... 365/189.05 |
| 2010/0157693 A1 | 6/2010 | Iwai et al. | |
| 2011/0032778 A1 | 2/2011 | Iwai et al. | |

FOREIGN PATENT DOCUMENTS

| JP | 08-087881 | 4/1996 |
| JP | 10-289578 | 10/1998 |
| JP | 2009-183796 | 8/2009 |

OTHER PUBLICATIONS

Iwai, et al. Low Power Embedded DRAM using 0.6V Super Retention Mode with Word Line Data Mirroring, 2009 IEEE Asian Solid-State Circuits Conference, pp. 209-212.

* cited by examiner

*Primary Examiner* — Tuan T. Nguyen
(74) *Attorney, Agent, or Firm* — Turocy & Watson, LLP

(57) ABSTRACT

A semiconductor storage device includes: a memory cell array that includes a plurality of memory cells having a cell transistor formed on a well subjected to application of a predetermined substrate potential; a memory cell array control circuit that switches the number of memory cells, for use in storage of data of 1 bit in a normal operation state, to m (m is a natural number) and switches the number of memory cells, for use in storage of data of 1 bit in a standby state, to n (n is a natural number larger than m); and a substrate potential control circuit that controls the substrate potential in the normal operation state to a first substrate potential and controls the substrate potential in the standby state to a second substrate potential (the second substrate potential>the first substrate potential).

20 Claims, 7 Drawing Sheets

SEMICONDUCTOR STORAGE DEVICE

CROSS-REFERENCE TO RELATED APPLICATIONS

This application is based upon and claims the benefit of priority from the prior Japanese Patent Application No. 2009-207218, filed on Sep. 8, 2009, the entire contents of which are incorporated herein by reference.

BACKGROUND OF THE INVENTION

1. Field of the Invention

The present invention relates to a semiconductor storage device such as a DRAM.

2. Description of the Related Art

Recently, a low-power-consumption embedded DRAM provided for mobile applications is of increasing importance, and various embedded DRAMs have been developed as a method for reducing standby power consumption. As one of the methods, the low power consumption is realized by improving data retention characteristics (hereinafter referred to as "retention characteristics") in a standby state. For example, there has been proposed a method in which a substrate potential of a cell transistor is changed in a standby state to thereby improve the retention characteristics (Patent Document 1: Japanese Patent Application Laid-Open No. 10-289578)

However, since mobile applications now require a lot of complex processing, standby power consumption should be further reduced.

SUMMARY OF THE INVENTION

A semiconductor storage device according to an aspect of the present invention includes: a memory cell array that includes a plurality of word lines and data lines intersecting with each other and a plurality of memory cells each provided at an intersection of the word line and the data line, the memory cell having a cell transistor formed on a well subjected to application of a predetermined substrate potential; a memory cell array control circuit that controls the memory cell array; a substrate potential control circuit that controls the substrate potential; and an operation state switching circuit that generates/outputs a first control signal for switching the memory cell array control circuit between a normal operation state and a standby state in accordance with the operation state and a second control signal for switching the substrate potential control circuit between the normal operation state and the standby state in accordance with the operation state, wherein the memory cell array control circuit, in response to the first control signal, switches the number of memory cells, for use in storage of data of 1 bit in the normal operation state, to m (m is a natural number) and switches the number of memory cells, for use in storage of data of 1 bit in the standby state, to n (n is a natural number larger than m), the substrate potential control circuit, in response to the second control signal, controls the substrate potential in the normal operation state to a first substrate potential and controls the substrate potential in the standby state to a second substrate potential (the second substrate potential>the first substrate potential).

A semiconductor storage device according to another aspect of the present invention includes: a memory cell array that includes a plurality of word lines and data lines intersecting with each other and a plurality of memory cells each provided at an intersection of the word line and the data line, the memory cell having a cell transistor formed on a well subjected to application of a predetermined substrate potential; a memory cell array control circuit that controls the memory cell array; a substrate potential control circuit that controls the substrate potential; and an operation state switching circuit that generates/outputs a first control signal for switching the memory cell array control circuit between a normal operation state and a standby state in accordance with the operation state and a second control signal for switching the substrate potential control circuit between the normal operation state and the standby state in accordance with the operation state, wherein the memory cell array control circuit, in response to the first control signal, switches the number of memory cells, for use in storage of data of 1 bit in the normal operation state, to m (m is a natural number) and switches the number of memory cells, for use in storage of data of 1 bit in the standby state, to n (n is a natural number larger than m), the substrate potential control circuit, in response to the second control signal, controls the substrate potential in the normal operation state to a first substrate potential, controls the substrate potential in the standby state to a second substrate potential (the second substrate potential>the first substrate potential), and controls the substrate potential during a burst refresh operation in the standby state to a third substrate potential (the third substrate potential<the second substrate potential).

A semiconductor storage device according to still another aspect of the present invention includes: a memory cell array that includes a plurality of word lines and data lines intersecting with each other and a plurality of memory cells each provided at an intersection of the word line and the data line, the memory cell having a cell transistor formed on a well subjected to application of a predetermined substrate potential; a memory cell array control circuit that controls the memory cell array; a substrate potential control circuit that controls the substrate potential; and an operation state switching circuit that controls the memory cell array control circuit and the substrate potential control circuit in accordance with a normal operation state/a standby state, wherein when the operation state is switched from the normal operation state to the standby state, the operation state switching circuit controls the substrate potential control circuit to control the substrate potential from a first substrate potential to a second substrate potential (the second substrate potential>the first substrate potential) and thereafter controls the memory cell array control circuit to switch the number of memory cells, for use in storage of data of 1 bit, from m (m is a natural number) to n (n is a natural number larger than m), and when the operation state is switched from the standby state to the normal operation state, the operation state switching circuit controls the substrate potential control circuit to control the substrate potential from the second substrate potential to the first substrate potential and thereafter controls the memory cell array control circuit to switch the number of memory cells, for use in storage of data of 1 bit, from n to m.

DETAILED DESCRIPTION OF THE EMBODIMENTS

Hereinafter, embodiments of the semiconductor storage device according to the invention will be described in detail with reference to the drawings.

First Embodiment

Figure 1:
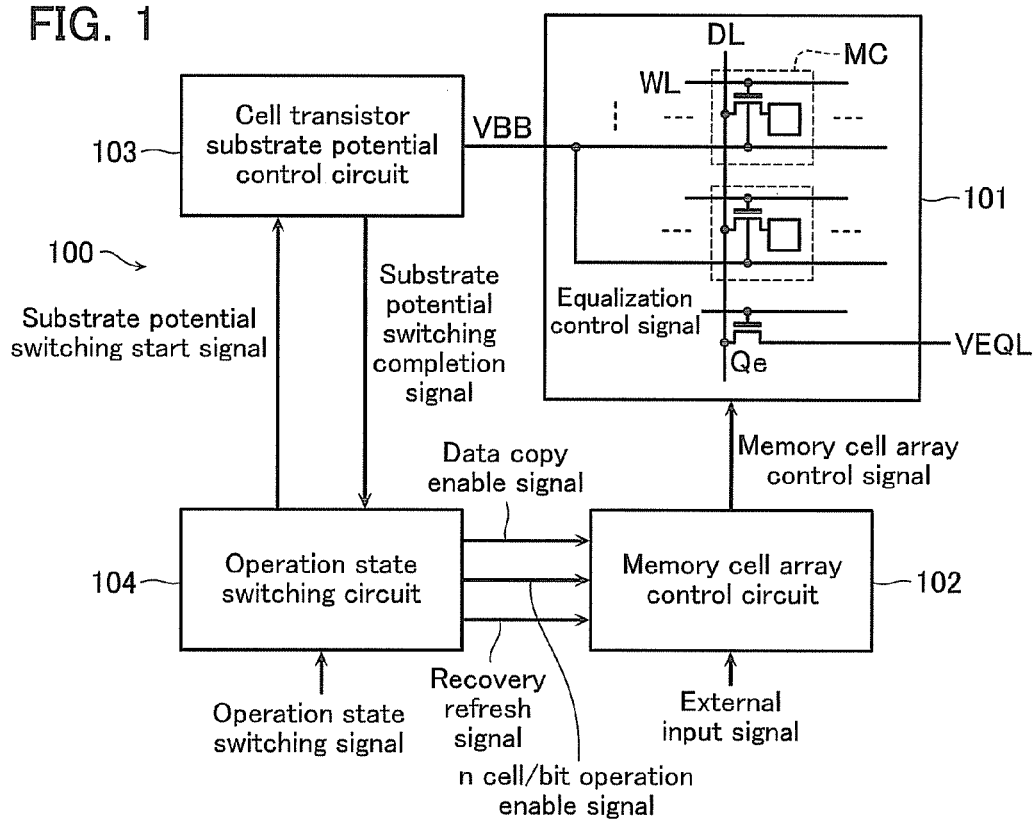
FIG. 1 is a block diagram of a semiconductor memory according to a first embodiment of the invention.

First, a semiconductor memory according to a first embodiment of the invention will be described with reference to FIG. 1.

A semiconductor memory 100 according to the first embodiment includes a memory cell array 101 including a plurality of word lines WL and data lines DL intersecting with each other, memory cells MC each connected to the intersection of the word line WL and the data line DL, and an equalization transistor Qe connected to the data line DL. Each memory cell MC has a DRAM structure. Namely, each memory cell MC includes one transistor (hereinafter referred to as a "cell transistor") and one capacitor (hereinafter referred to as a "cell capacitor"). The cell transistor is an n-channel MOS transistor and is formed on a well subjected to application of a predetermined substrate potential VBB. The cell transistor is controlled by the potential of the word line WL. When the word line WL is selected, the cell transistor connects the data line DL to the cell capacitor. When the word line WL is not selected, the cell transistor separates the data line DL from the cell capacitor. According to whether data is "0" or "1", a predetermined potential VDD or a potential of 0 V is stored as data in the cell capacitor. The equalization transistor Qe supplies an equalization potential VEQL, which is a potential of the data line DL, and is controlled by an equalization control signal.

The semiconductor memory 100 further includes a memory cell array control circuit 102, a cell transistor substrate potential control circuit 103, and an operation state switching circuit 104. The memory cell array control circuit 102 controls the memory cell array 101 in response to an external input signal. The cell transistor substrate potential control circuit 103 controls the substrate potential VBB of the memory cell array 101. The operation state switching circuit 104 controls the memory cell array control circuit 102 and the cell transistor substrate potential control circuit 103 in accordance with an operation state.

Figure 2:
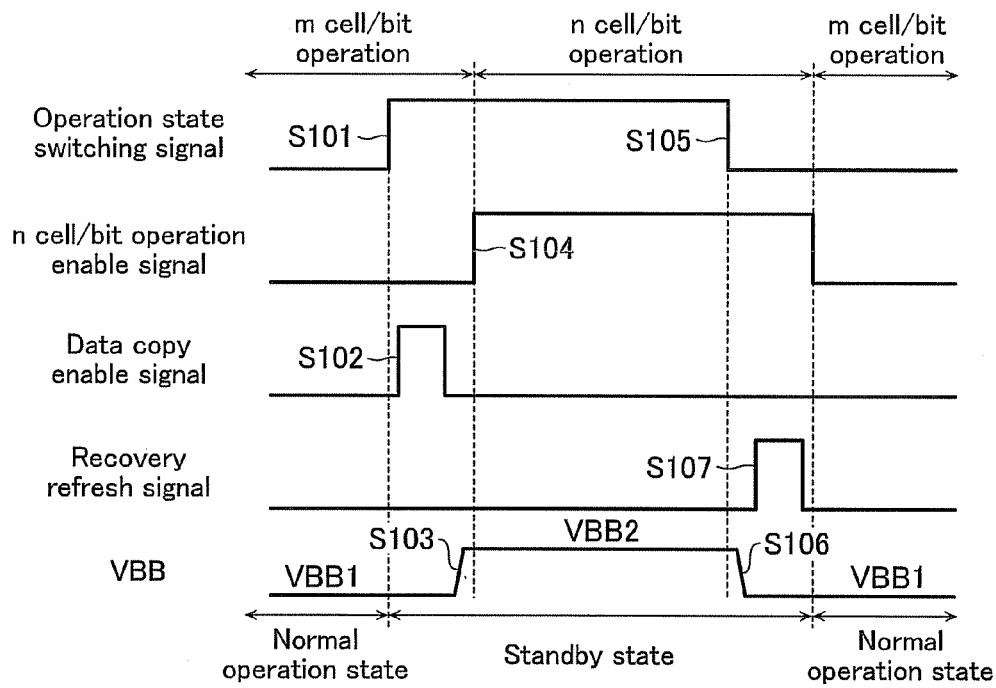
FIG. 2 is an operation waveform chart in the semiconductor memory according to the first embodiment.

Next, a switching operation between a normal operation state and a standby state in the semiconductor memory 100 will be described with reference to an operation waveform chart of FIG. 2. In this example, in the normal operation state, the substrate potential VBB is a first substrate potential VBB1, and the number of memory cells for use in storage of data of 1 bit is m (m is a natural number). In the standby state, the substrate potential VBB is a second substrate potential VBB2 higher than the first substrate potential VBB1, and the number of memory cells for use in storage of data of 1 bit is n (n is a natural number larger than m). In the following description and drawings, the case where the number of memory cells for use in storage of data of 1 bit is n in a certain operation is also called "n cell/bit operation".

When the state of the semiconductor memory 100 is switched from the normal operation state to the standby state, the operation state switching circuit 104 of the semiconductor memory 100 in the normal operation state first receives an activated operation state switching signal (S101). The operation state switching signal is a signal that instructs switching between the normal operation state and the standby state.

When the operation state switching circuit 104 receives the operation state switching signal, it issues a data copy enable signal to the memory cell array control circuit 102 (S102), whereby the memory cell array control circuit 102 issues a memory cell array control signal for use in copying of data from a copy source memory cell MC to a copy destination memory cell MC. The copy source memory cell MC is a memory cell MC storing data held before and after switching of the operation state, and the copy destination memory cell MC is a memory cell MC storing data that may be corrupted when the operation state is switched to the standby state. In the copying of data, the data is copied to n to m memory cells MC; however, when data stored in the copy source memory cell is copied as it is, data of reverse logic to the data stored in the copy source memory cell may be copied.

After completion of copying the data, the operation state switching circuit 104 issues a substrate potential switching start signal, which is a second control signal, to the cell transistor substrate potential control circuit 103, whereby the cell transistor substrate potential control circuit 103 boosts the substrate potential VBB (S103). When the substrate potential VBB reaches the second substrate potential VBB2, the cell transistor substrate potential control circuit 103 issues a substrate potential switching completion signal to the operation state switching circuit 104 and notifies that the substrate potential VBB has reached the second substrate potential VBB2. The substrate potential VBB is boosted to the second substrate potential VBB2, whereby a leakage current generated in the cell transistor in the standby state can be reduced, and thus the retention characteristics of the memory cell MC can be enhanced.

When the operation state switching circuit 104 receives the substrate potential switching completion signal, it issues an n cell/bit operation enable signal, which is a first control signal, to the memory cell array control circuit 102 (S104).

The above operation completes the transition from the normal operation state in m cell/bit operation to the standby state in the n cell/bit operation.

In the transition from the standby state to the normal operation state, the operation state switching circuit 104 of the semiconductor memory 100 in the standby state first receives an inactivated operation state switching signal (S105).

When the operation state switching circuit 104 receives the operation state switching signal, it issues the substrate potential switching start signal, which is the second control signal, to the cell transistor substrate potential control circuit 103, whereby the cell transistor substrate potential control circuit 103 drops the substrate potential VBB (S106). When the substrate potential VBB reaches the first substrate potential VBB1, the cell transistor substrate potential control circuit 103 issues the substrate potential switching completion signal to the operation state switching circuit 104 and notifies that the substrate potential VBB has reached the first substrate potential VBB1. The substrate potential VBB is dropped to the first substrate potential VBB1, whereby the capacity of the data line DL in the normal operation state can be kept small, and high-speed data reading can be realized.

When the operation state switching circuit 104 receives the substrate potential switching completion signal, it issues a recovery refresh signal to the memory cell array control circuit 102 (S107), whereby the memory cell array control circuit 102 issues a memory cell array control signal, for use in recovery refresh, to the memory cell array 101. The recovery refresh is performed in the n cell/bit operation.

After completion of the recovery refresh, the operation state switching circuit 104 issues an inactivated n cell/bit operation enable signal to the memory cell array control circuit 102 for the purpose of transition to the m cell/bit operation.

The above operation completes the transition from the standby state in the n cell/bit operation to the normal operation state in the m cell/bit operation.

Next, examples of a data storage method for storing data of 1 bit in the standby state will be described using FIGS. 3 to 5.

Figure 3:
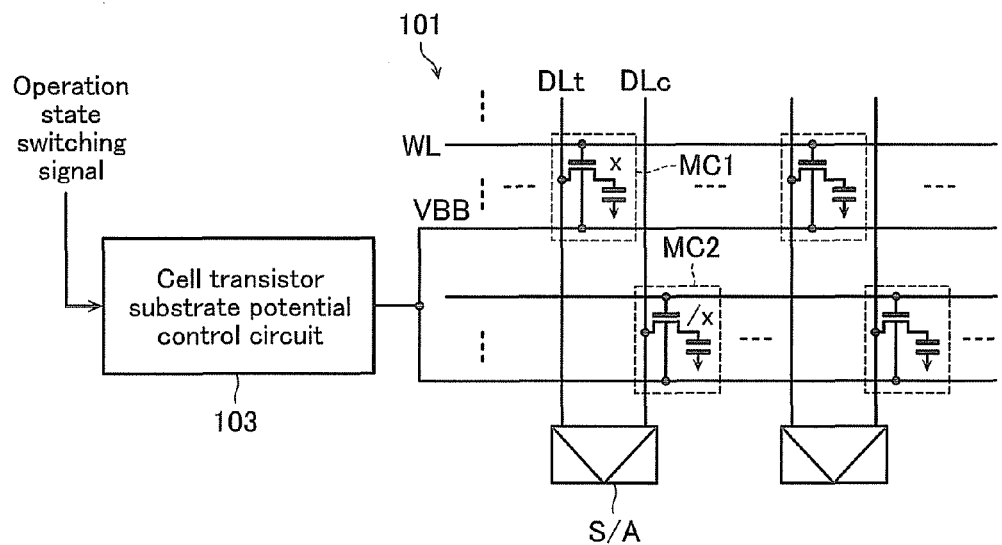
FIG. 3 is a view explaining an example of a data storage method in the semiconductor memory according to the first embodiment.
Figure 4:
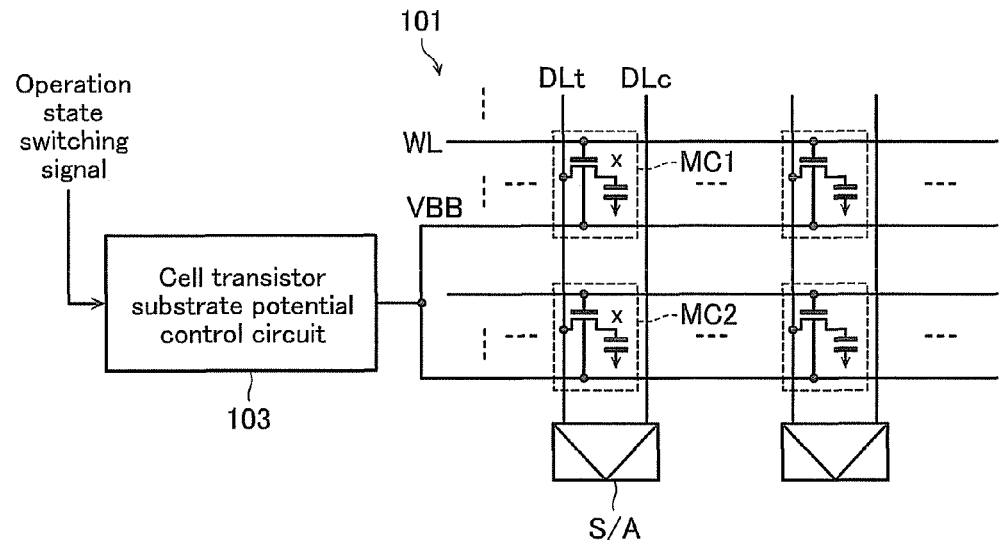
FIG. 4 is a view explaining another example of a data storage method in the semiconductor memory according to the first embodiment.

FIGS. 3 and 4 show an example of the data storage method in a 2 cell/bit operation. In the following description, a copy source memory cell MC in which data held even before and after the switching of the operation state is stored is a "memory cell MC1", and a copy destination memory cell MC in which data that is corrupted when the operation state is switched from the normal operation state to the standby state is stored is a "memory cell MC2".

Two data lines DLt and DLc of the memory cell array 101 constitute a pair of data lines. The data lines DLt and DLc have at their ends a sense amplifier circuit S/A that senses/amplifies a potential difference between the data lines DLt and DLc.

In the example shown in FIG. 3, the memory cell MC1 is connected to the data line DLt, and the memory cell MC2 is connected to the data line DLc. The memory cell MC2 stores reverse logical data/X ("/" means a reverse logic, and the same holds for the following) of data X stored in the memory cell MC1 that is a copy source, whereby data can be differentially read through the data lines DLt and DLc.

In the example shown in FIG. 4, the memory cells MC1 and MC2 are connected to the same data line DLt. The memory cell MC2 stores, as it is, the data X stored in the memory cell MC1 that is a copy source. According to this constitution, the amount of electrical charge accumulated in a cell capacitor can be doubled relative to a 1 cell/bit operation. In this example, the data line DLt and the data line DLc that is applied with a predetermined reference potential are compared with each other to discriminate data. The data line DLt and the data line DLc may be counterchanged.

Figure 5:
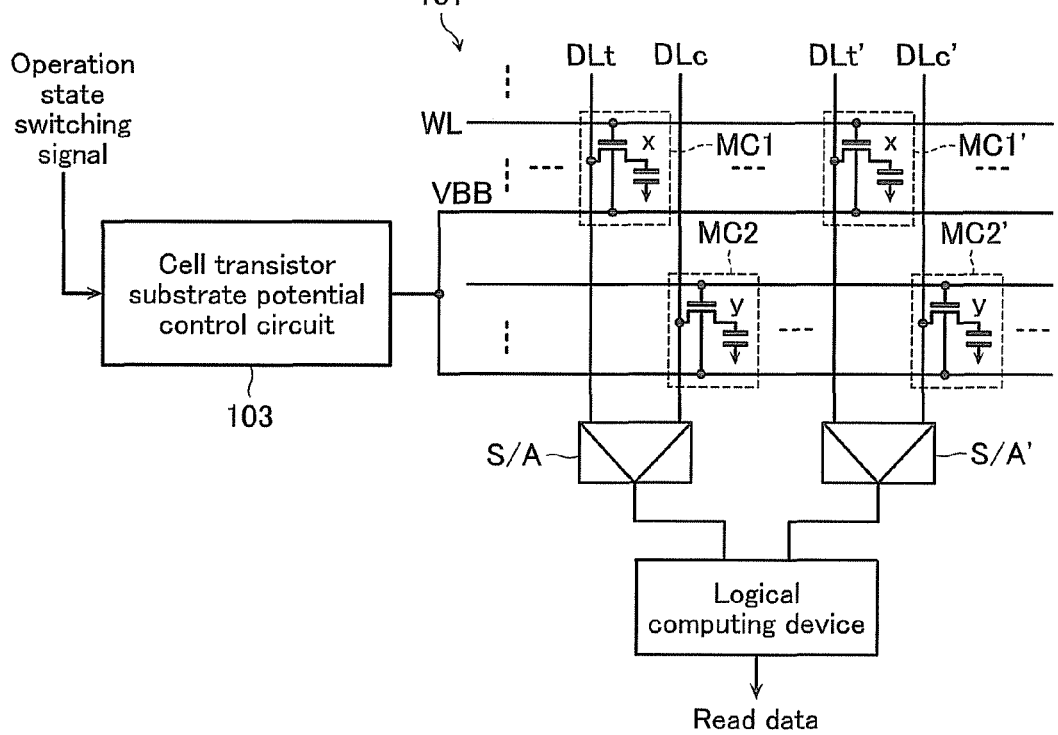
FIG. 5 is a view explaining still another example of a data storage method in the semiconductor memory according to the first embodiment.

In the example shown in FIG. 5, data of 1 bit is stored by two memory cells MC1 and MC1' connected respectively to data lines DLt and DLt'. The memory cell MC1' stores, as it is, data X stored in the memory cell MC1. The data lines DLt and DLc are connected at their ends to a differential sense amplifier circuit S/A, and the data lines DLt' and DLc' are connected at their ends to a differential sense amplifier circuit S/A'. A logical computing device is further provided and discriminates stored data from the outputs of the sense amplifier circuits S/A and S/A'. The output of the logic computing device is read data. By virtue of the use of the outputs of the two sense amplifier circuits S/A and S/A', the reliability of the read data can be further enhanced relative to the example shown in FIG. 3. Meanwhile, data of 1 bit can be stored by two memory cells MC2 and MC2' connected respectively to the data lines DLc and DLc'. The data storage methods shown in FIGS. 3 to 5 are applicable not only to this embodiment but also to the following each embodiment.

Figure 6:
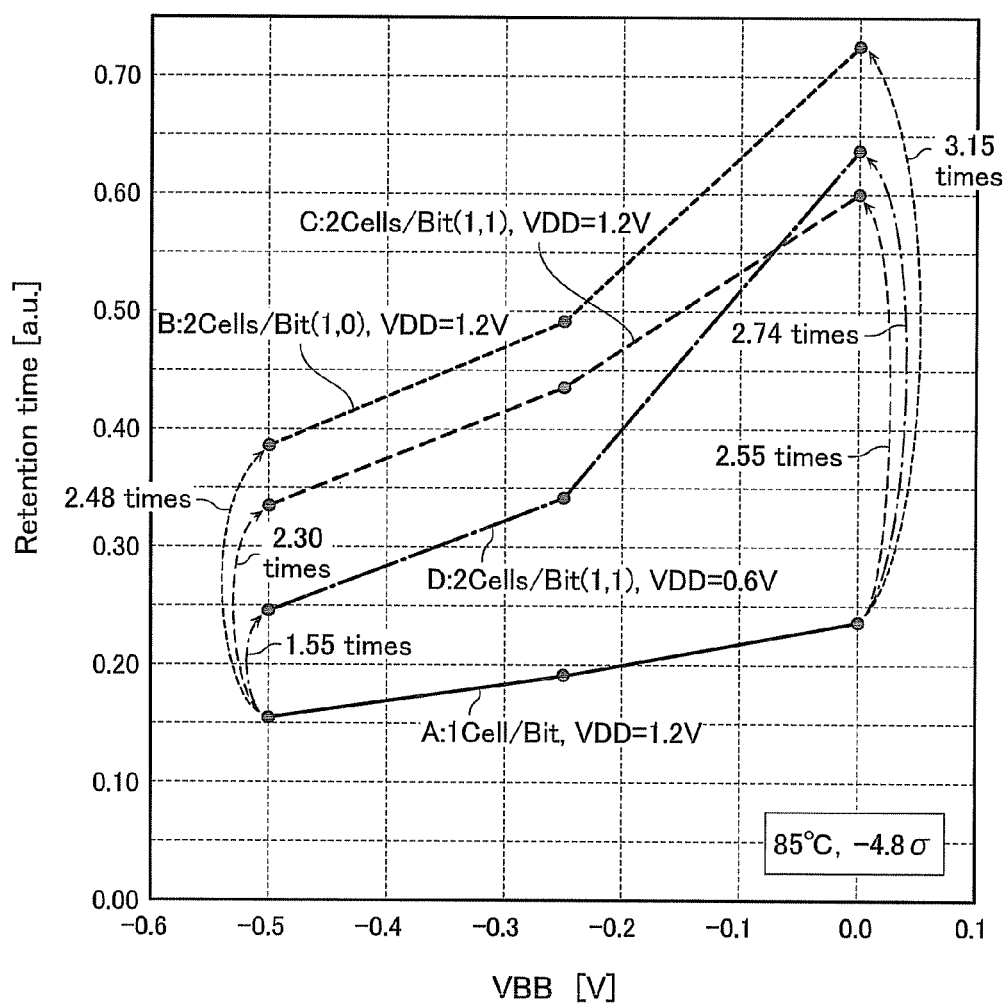
FIG. 6 is a graph showing a relationship between a substrate potential and a retention time in the semiconductor memory according to the first embodiment.

FIG. 6 is a graph for explaining a relationship between a substrate potential and a retention time in this embodiment. FIG. 6 shows a measurement result at an environmental temperature of 85° C. In FIG. 6, A shows the case of the 1 cell/bit operation and shows a comparative example to be compared with a 2 cell/bit operation. B shows the case of the data storage method shown in FIG. 3. C shows the case of the data storage method shown in FIG. 4. In A to C, the data line potential VDD is 1.2 V. In FIG. 6, "(1, 0)" means that the data stored in the memory cell MC2 is data of reverse logic to the data stored in the memory cell MC1, and "(1, 1)" means that the data stored in the memory cell MC2 is the same as the data stored in the memory cell MC1.

As shown in FIG. 6, the larger the substrate potential VBB, the longer the retention time; however, the improved width in the 2 bit/cell operation is larger than the improved width in the 1 bit/cell operation. Specifically, when the substrate potential VBB is boosted from −0.5 V to 0.0 V, the improved width is about 0.08 a. u. in the 1 cell/bit operation shown in A of FIG. 6. Meanwhile, in the 2 cell/bit operation shown in B, the improved width is about 0.34 a. u., and in the 2 cell/bit operation shown in C, the improved width is about 0.265 a. u.

In this embodiment, since not only the substrate potential VBB but also the number of memory cells for use in the storage of data of 1 bit is changed, the effect of improvement of the retention time can be significantly obtained more than in the case of changing only the substrate potential VBB as with the comparative example. Specifically, according to the storage method shown in FIG. 3, when the substrate potential VBB is −0.5 V, the retention time is 2.48 times the retention time in the 1 cell/bit operation shown in A of FIG. 6; however, when the substrate potential VBB is 0.0 V, the retention time is improved so that the difference is 3.15 times. Likewise, according to the storage method shown in FIG. 4, when the substrate potential VBB is −0.5 V, the retention time is 2.30 times the retention time in the 1 cell/bit operation shown in A of FIG. 6; however, when the substrate potential VBB is 0.0 V, the retention time is improved so that the difference is 2.55 times.

Figure 7:
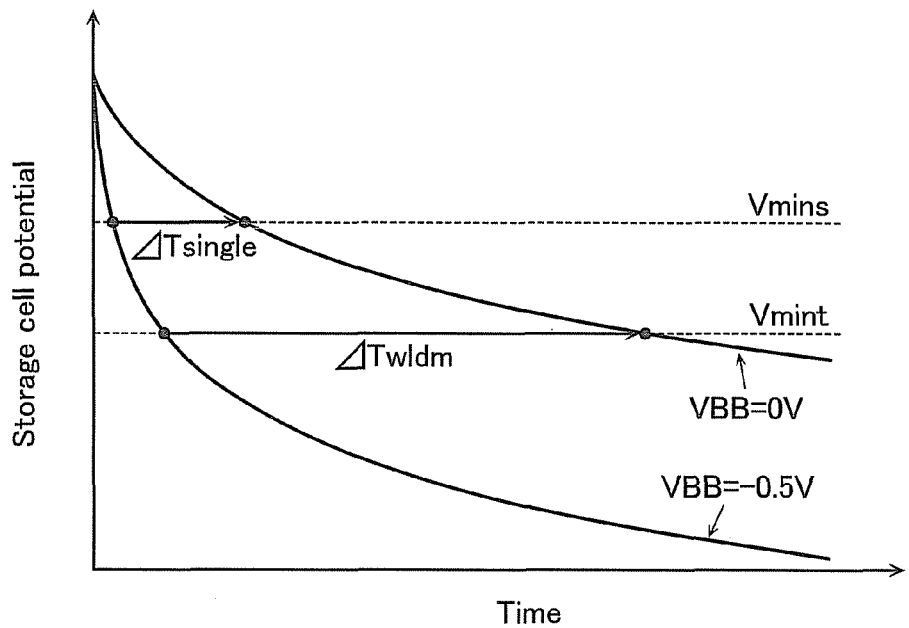
FIG. 7 is a graph showing a relationship between a time and a storage cell potential in the semiconductor memory according to the first embodiment.

FIG. 7 is a graph showing a relationship between the passage of time and a storage cell potential. The storage cell potential decreases with the passage of time; however, as seen in FIG. 7, when the substrate potential VBB is raised, the storage cell potential rather gradually decreases. Specifically, when the minimum storage cell potential required for reading data in the 1 cell/bit operation is Vmins, and the minimum storage cell potential required for reading data in the 2 cell/bit operation is Vmint, Vmins>Vmint is satisfied. In the 1 cell/bit operation, the time until reaching Vmins that is the minimum storage cell potential required for reading data extends by time ΔTsingle. In the 2 cell/bit operation, the time until reaching Vmint extends by time ΔTwldm. Namely, it is found that, compared with the 1 cell/bit operation at the substrate potential VBB of −0.5 V, in the 2 cell/bit operation at the substrate potential VBB of 0.0 V, the retention time is improved by ΔTwldm−ΔTsingle. The retention time is proportional to Exp (VBB).

According to this embodiment, in the normal operation state, a high-speed operation can be realized by reducing the substrate potential, and in the standby state, a multiple cell/bit operation at a high substrate potential can ensure a long retention time. Thus, compared with the comparative example, this embodiment can realize the lower power consumption.

Second Embodiment

Figure 8:
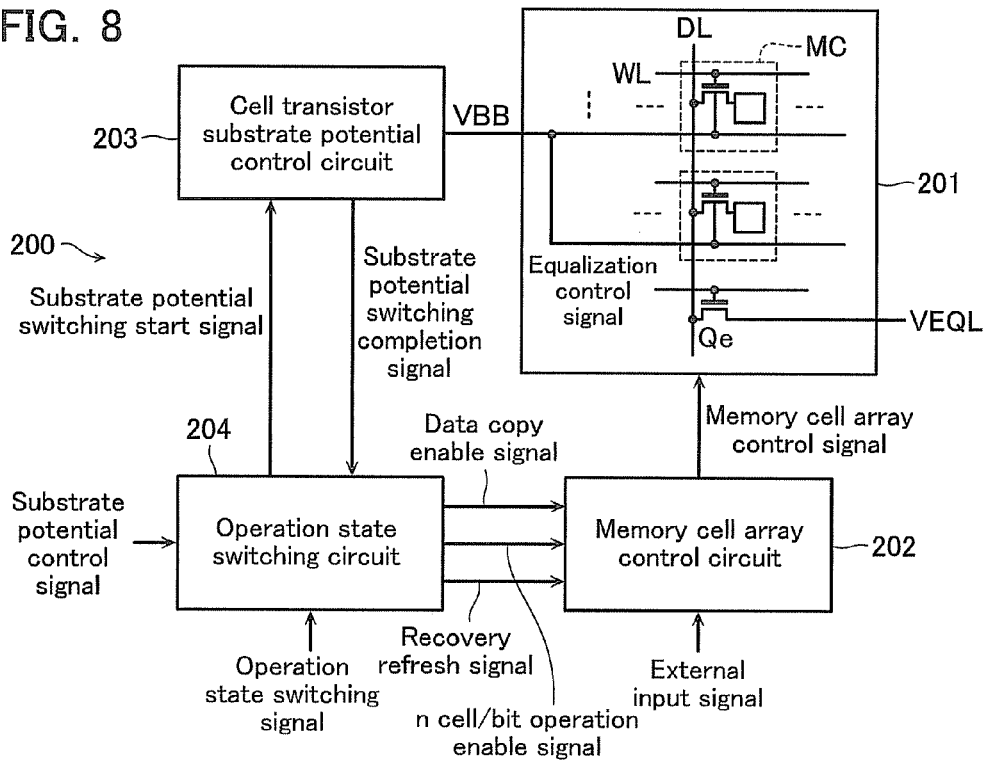
FIG. 8 is a block diagram of a semiconductor memory according to a second embodiment of the invention.

FIG. 8 is a block diagram of a semiconductor memory according to a second embodiment of the invention.

A semiconductor memory 200 according to the second embodiment is common to the semiconductor memory 100 in that the semiconductor memory 200 includes a memory cell array 201, a memory cell array control circuit 202, a cell transistor substrate potential control circuit 203, and an operation state switching circuit 204.

However, the semiconductor memory 200 is different from the semiconductor memory 100 in that a substrate potential control signal is input to the operation state switching circuit 204. The substrate potential control signal is a signal that instructs adjustment of the substrate potential VBB, and by virtue of the signal, the substrate potential VBB can be adjusted not only in switching of the operation state but also during the standby state.

Figure 9:
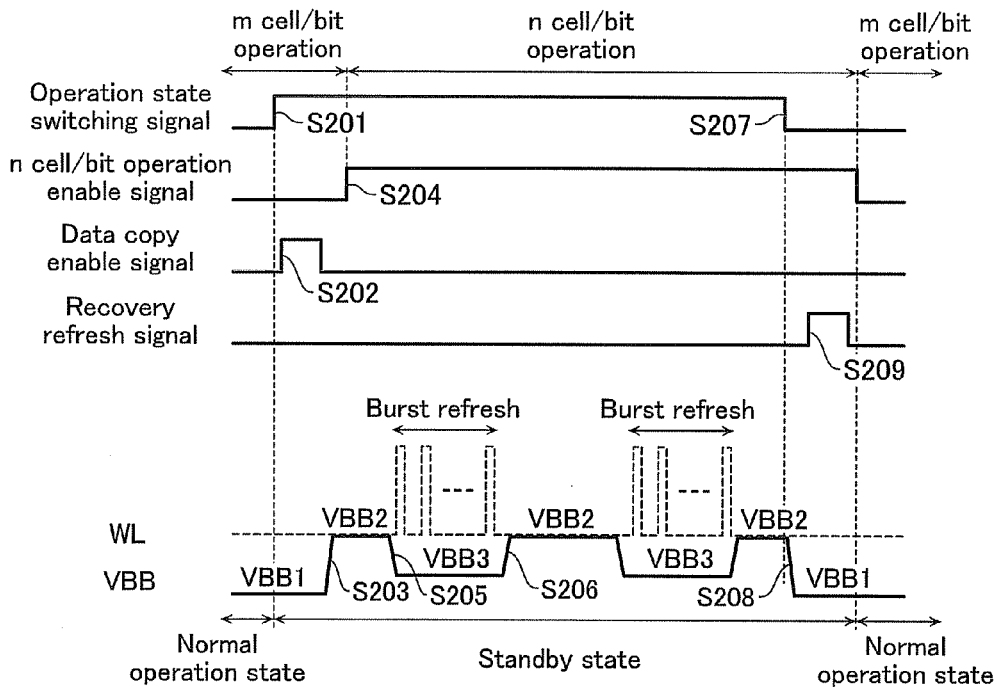
FIG. 9 is an operation waveform chart in the semiconductor memory according to the second embodiment.

Next, the operation of the semiconductor memory 200 will be described with reference to FIG. 9. S201 to S204 concerning switching from the normal operation state in the m cell/bit operation to the standby state in the n cell/bit operation are similar to S101 to S104 in FIG. 2, and thus the descriptions thereof will be omitted. S207 to S209 concerning switching from the standby state in the n cell/bit operation to the normal operation state in the m cell/bit operation are similar to S105 to S107 in FIG. 2, and thus the descriptions thereof will be omitted.

When the semiconductor memory 200 is in the standby state, the semiconductor memory 200 executes burst refresh of the memory cell MC. At the start of the execution of the burst refresh, the semiconductor memory 200 issues the substrate potential control signal to the operation state switching circuit 204. The substrate potential control signal is for use in the adjustment of the substrate potential VBB to a third substrate potential VBB3. When the operation state switching circuit 204 receives the substrate potential control signal, it controls the cell transistor substrate potential control circuit 203 to adjust the substrate potential VBB from a second substrate potential VBB2 to the third substrate potential VBB3 (S205). The third substrate potential VBB3 is lower than the second substrate potential VBB2.

After the termination of the burst refresh, the semiconductor memory 200 issues a substrate potential control signal, for use in boosting of the substrate potential VBB from the third substrate potential VBB3 to the second substrate potential VBB2, to the operation state switching circuit 204. When the operation state switching circuit 204 receives the substrate potential control signal, it controls the cell transistor substrate potential control circuit 203 to boost the substrate potential VBB to the second substrate potential VBB2 (S206).

The substrate potential VBB is adjusted to the third substrate potential VBB3 lower than the second substrate potential VBB2, whereby the wiring capacity of the data line DL can be reduced. Namely, according to this embodiment, not only can the effects similar to those obtained in the first embodiment be obtained, but also a read margin upon the burst refresh in the standby state can be increased, and the retention time can be further increased.

Figure 10:
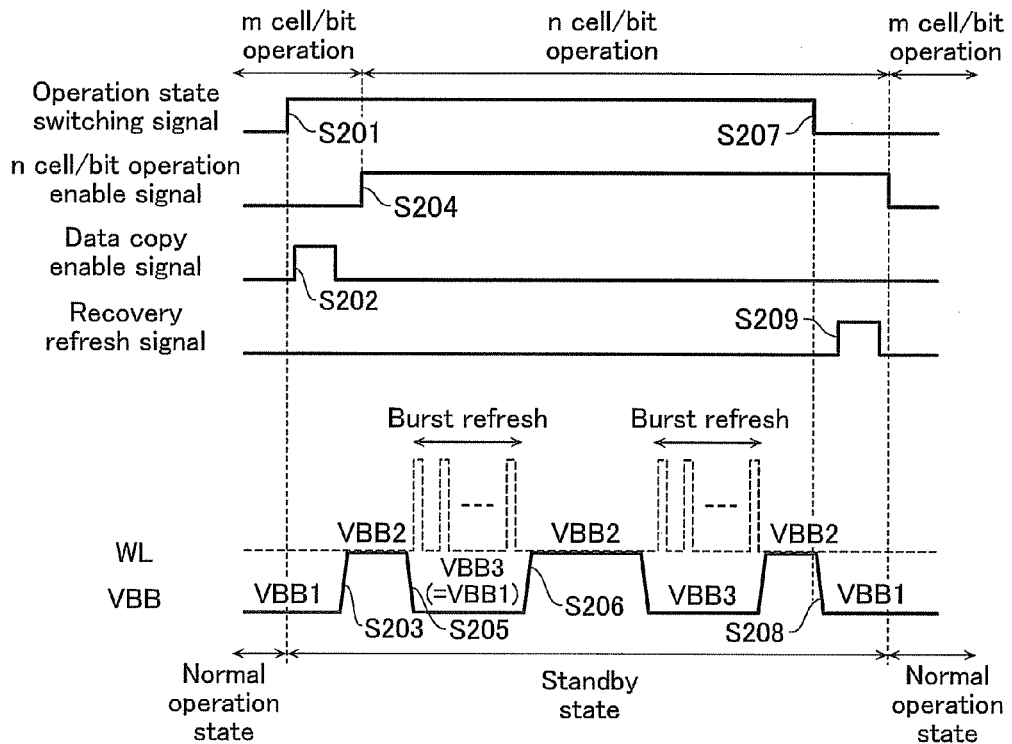
FIG. 10 is another operation waveform chart in the semiconductor memory according to the second embodiment.

Since the third substrate potential VBB3 may be lower than the second substrate potential VBB2, the third substrate potential VBB3 may be the same value as the first substrate potential VBB1, as shown in FIG. 10. In this case, it is only necessary to realize the two substrate potentials VBB1 (or VBB3) and VBB2 as the substrate potential VBB, the circuit configuration of the cell transistor substrate potential control circuit 203 can be more simplified than in the case shown in FIG. 8.

Third Embodiment

Figure 11:
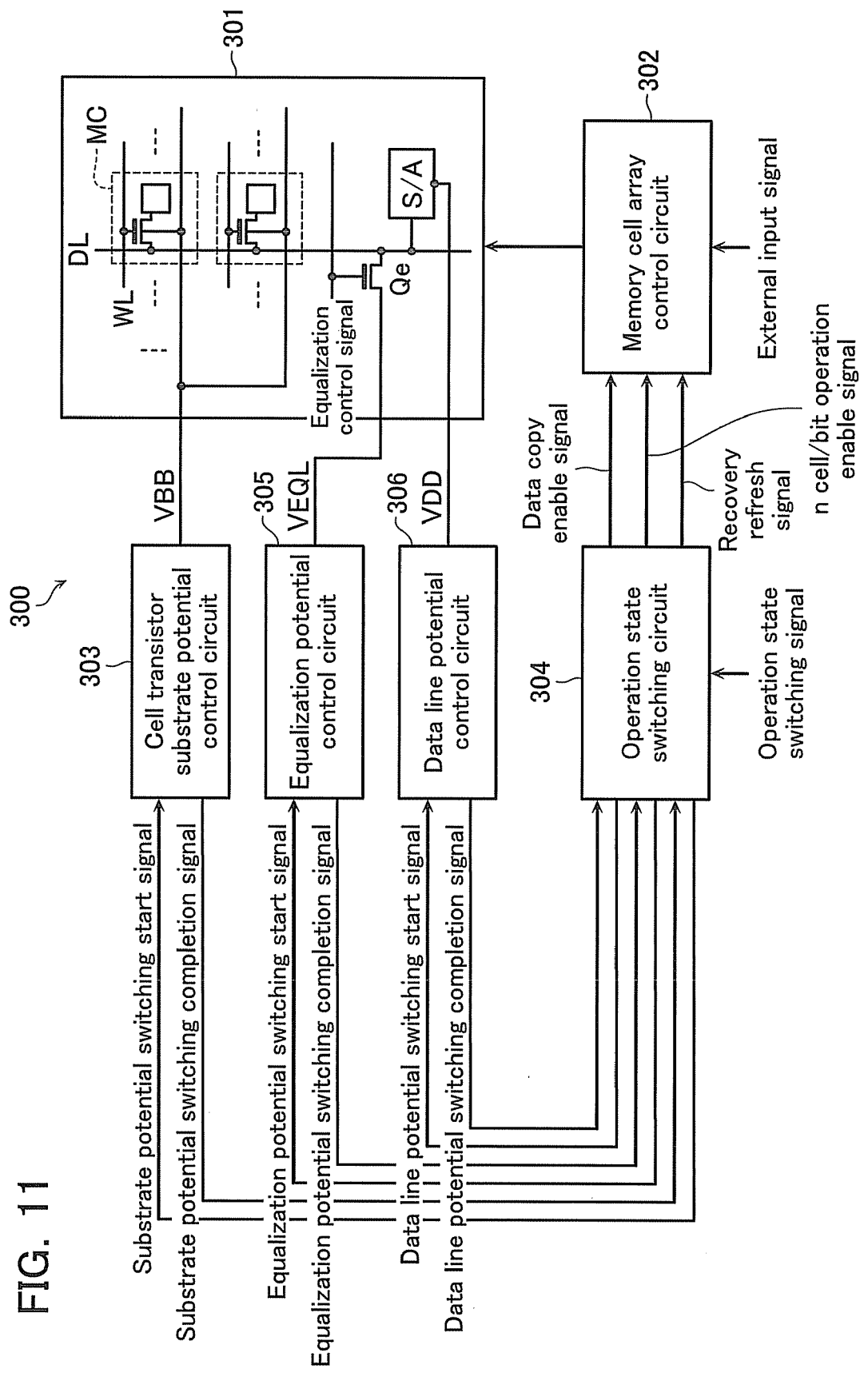
FIG. 11 is a block diagram of a semiconductor memory according to a third embodiment of the invention.

FIG. 11 is a block diagram of a semiconductor memory according to a third embodiment of the invention.

A semiconductor memory 300 according to the third embodiment includes a memory cell array 301, a memory cell array control circuit 302, a cell transistor substrate potential control circuit 303, and an operation state switching circuit 304 and further includes an equalization potential control circuit 305 and a data line potential control circuit 306.

The equalization potential control circuit 305 is a circuit that adjusts an equalization potential VEQL supplied to a data line DL through a transistor Qe. The equalization potential control circuit 305 receives an equalization potential switching start signal that is a fourth control signal issued from the operation state switching circuit 304 to thereby start the adjustment of the equalization potential VEQL. After the adjustment, the equalization potential control circuit 305 issues an equalization potential switching completion signal to the operation state switching circuit 304.

The data line potential control circuit 306 is a circuit that adjusts an operating potential (a data line potential) VDD of a sense amplifier circuit S/A of the memory cell array 301. The data line potential control circuit 306 receives a data line potential switching start signal that is a third control signal issued from the operation state switching circuit 304 to thereby start the adjustment of the data line potential VDD. After the adjustment, the data line potential control circuit 306 issues a data line potential switching completion signal to the operation state switching circuit 304.

Figure 12:
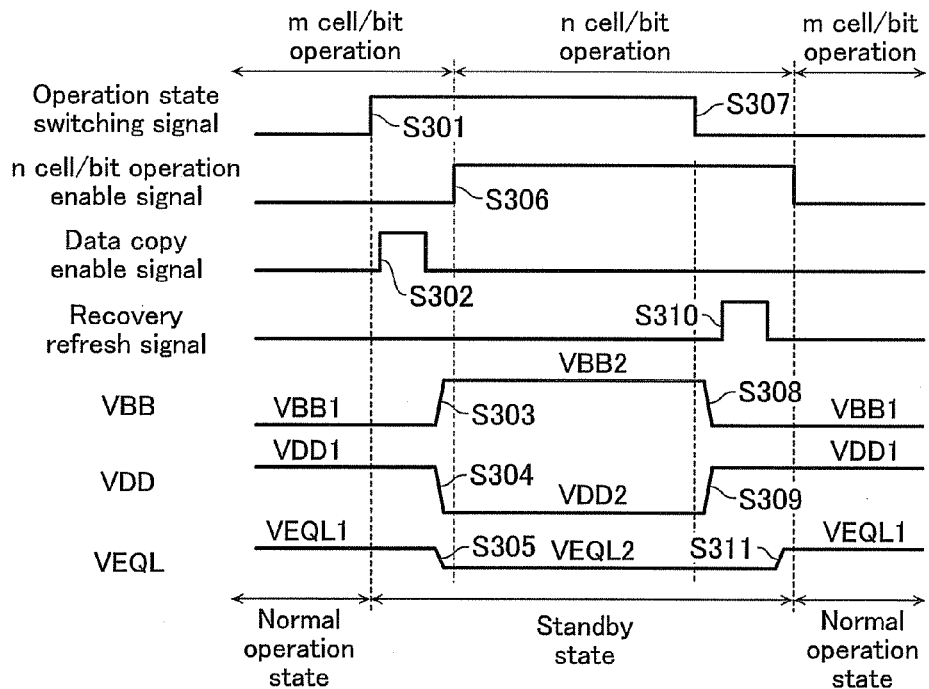
FIG. 12 is an operation waveform chart in the semiconductor memory according to the third embodiment.

Next, an operation in switching between the normal operation state and the standby state in the semiconductor memory 300 will be described with reference to FIG. 12.

In the transition from the normal operation state to the standby state, the semiconductor memory 300 in the normal operation state first receives an activated operation state switching signal from the outside (S301). When the operation state switching circuit 304 receives the operation state switching signal, it issues a data copy enable signal to the memory cell array control circuit 302, and copying of data is started (S302).

After completion of copying of data, the operation state switching circuit 304 issues a substrate potential switching start signal to the cell transistor substrate potential control circuit 303 and, at the same time, issues an equalization potential switching start signal and a data line potential switching start signal respectively to the equalization potential control circuit 305 and the data line potential control circuit 306.

When the cell transistor substrate potential control circuit 303 receives the substrate potential switching start signal, it switches the substrate potential VBB from a first substrate potential VBB1 to a second substrate potential VBB2 (S303).

When the equalization potential control circuit 305 receives the equalization potential switching start signal, it initiates switching of the equalization potential VEQL from a first equalization potential VEQL1 to a second equalization potential VEQL2. After completion of the switching, the equalization potential control circuit 305 issues an equalization potential switching completion signal to the operation state switching circuit 304 (S305). The second equalization potential VEQL2 is lower than the first equalization potential VEQL1.

When the data line potential control circuit 306 receives the data line potential switching start signal, it initiates switching of the data line potential VDD from the first data line potential VDD1 to the second data line potential VDD2. After completion of the switching, the data line potential control circuit 306 issues a data line potential switching completion signal to the operation state switching circuit 304 (S304). The second data line potential VDD2 is lower than the first data line potential VDD1.

When the operation state switching circuit 304 receives the substrate potential switching completion signal, the equalization potential switching completion signal, and the data line potential switching completion signal, it issues an n cell/bit operation enable signal to the memory cell array control circuit 302 (S306).

According to the above constitution, in the semiconductor memory 300, the operation state is switched from the normal operation state in the m cell/bit operation to the standby state in the n cell/bit operation.

In the transition from the standby state to the normal operation state, the semiconductor memory 300 in the standby state first receives an inactivated operation state switching signal from the outside (S307).

When the operation state switching circuit 304 receives the operation state switching signal, it issues the substrate potential switching start signal to the cell transistor substrate potential control circuit 303 and, at the same time, issues the data line potential switching start signal to the data line potential control circuit 306.

When the cell transistor substrate potential control circuit 303 receives the substrate potential switching start signal, it drops the substrate potential VBB from the second substrate potential VBB2 to the first substrate potential VBB1 (S308) to thereafter issue the substrate potential switching completion signal to the operation state switching circuit 304.

When the data line potential control circuit 306 receives the data line potential switching start signal, it boosts the data line potential VDD from the second data line potential VDD2 to the first data line potential VDD1 (S309) to thereafter issue the data line potential switching completion signal to the operation state switching circuit 304.

When the operation state switching circuit 304 receives the substrate potential switching completion signal and the data line potential switching completion signal, it issues a recovery refresh signal to the memory cell array control circuit 302 (S310), whereby the memory cell array control circuit 302 issues a memory cell array control signal, for use in recovery refresh, to the memory cell array 301. The recovery refresh is performed in the n cell/bit operation.

After completion of the recovery refresh, the operation state switching circuit 304 issues the equalization potential switching start signal to the equalization potential control circuit 305. When the equalization potential control circuit 305 receives the equalization potential switching start signal, it boosts the equalization potential VEQL from the second equalization potential VEQL2 to the first equalization potential VEQL1 (S311) to thereafter issue the equalization potential switching completion signal to the operation state switching circuit 304.

When the operation state switching circuit 304 receives the equalization potential switching completion signal, it issues an inactivated n cell/bit operation enable signal to the memory cell array control circuit 302 for the purpose of transition to the m cell/bit operation.

According to the above constitution, in the semiconductor memory 300, the operation state is switched from the standby state in the n cell/bit operation to the normal operation state in the m cell/bit operation.

In this embodiment, the data line potential VDD2 in the standby state is lower than the data line potential VDD1 in the normal operation state, whereby the amplitude of the data line BL is reduced to enable power consumption to be reduced. As shown in D of FIG. 6, when the data line potential VDD is lowered from 1.2 V to 0.6 V, compared with the case of the first and second embodiments shown in A of FIG. 6, the degree of improvement of the retention time is significantly increased as the substrate potential VBB is increased. Specifically, when the data line potential VDD2 in the standby state is the same as the data line potential VDD1 in the normal operation state, the degree of improvement of the retention time in the case where the substrate potential VBB is increased from −0.5 V to 0.0 V is increased from 2.30 to only 2.55 times; however, when the data line potential VDD2 is 0.6 V, the degree of improvement of the retention time in the case where the substrate potential VBB is increased from −0.5 V to 0.0 V is increased from 1.55 to 2.74 times.

When the operation state is switched from the normal operation state to the standby state, the equalization potential VEQL is dropped simultaneously with boosting of the substrate potential VBB. Meanwhile, when the operation state is switched from the standby state to the normal operation state, the equalization potential VEQL is boosted after completion of recovery refresh. According to this constitution, a large read margin can be ensured by the low equalization potential VEQL2 during recovery refresh, and a time required for recovery refresh can be reduced, and at the same time, the restriction of the interval of refresh in switching from the standby state to the normal operation state can be relaxed.

What is claimed is:
1. A semiconductor storage device comprising:
a memory cell array that comprises a plurality of word lines and data lines intersecting with each other and a plurality of memory cells each provided at an intersection of the word line and the data line, the memory cell having a cell transistor formed on a well subjected to application of a predetermined substrate potential;
a memory cell array control circuit that controls the memory cell array;
a substrate potential control circuit that controls the substrate potential; and
an operation state switching circuit that generates/outputs a first control signal for switching the memory cell array control circuit between a normal operation state and a standby state in accordance with the operation state and a second control signal for switching the substrate potential control circuit between the normal operation state and the standby state in accordance with the operation state,
wherein the memory cell array control circuit, in response to the first control signal, switches the number of memory cells, for use in storage of data of 1 bit in the normal operation state, to m (m is a natural number) and switches the number of memory cells, for use in storage of data of 1 bit in the standby state, to n (n is a natural number larger than m), and the substrate potential control circuit, in response to the second control signal, controls the substrate potential in the normal operation state to a first substrate potential and controls the substrate potential in the standby state to a second substrate potential (the second substrate potential>the first substrate potential).

2. The semiconductor storage device according to claim 1, further comprising a plurality of sense amplifiers that sense/amplify a potential difference appearing between predetermined first and second data lines of the plurality of data lines.

3. The semiconductor storage device according to claim 2, wherein the memory cell array control circuit performs switching so that in the standby state, data of 1 bit is stored by the memory cell connected to the first data line and the memory cell connected to the second data line.

4. The semiconductor storage device according to claim 2, wherein the memory cell array control circuit performs switching so that in the standby state, data of 1 bit is stored by the two memory cells connected to the first data line.

5. The semiconductor storage device according to claim 2, further comprising an arithmetic circuit that discriminates data, stored in the memory cell, from the output of the two sense amplifiers.

6. The semiconductor storage device according to claim 2, further comprising:
  a data line potential control circuit that controls a data line potential serving as an amplitude range of the data line; and
  an equalization potential control circuit that controls an equalization potential for adjusting the potential of the data line,
  wherein the operation state switching circuit generates/outputs a third control signal that controls the data line potential control circuit in accordance with the normal operation state/the standby state and a fourth control signal that controls the equalization potential control circuit,
  the data line potential control circuit, in response to the third control signal, controls the data line potential in the normal operation state to a first data line potential and controls the data line potential in the standby state to a second data line potential (the second data line potential<the first data line potential), and
  the equalization potential control circuit, in response to the fourth control signal, controls the equalization potential in the normal operation state to a first equalization potential and controls the equalization potential in the standby state to a second equalization potential (the second equalization potential<the first equalization potential).

7. A semiconductor storage device comprising:
  a memory cell array that comprises a plurality of word lines and data lines intersecting with each other and a plurality of memory cells each provided at an intersection of the word line and the data line, the memory cell having a cell transistor formed on a well subjected to application of a predetermined substrate potential;
  a memory cell array control circuit that controls the memory cell array;
  a substrate potential control circuit that controls the substrate potential; and
  an operation state switching circuit that generates/outputs a first control signal for switching the memory cell array control circuit between a normal operation state and a standby state in accordance with the operation state and a second control signal for switching the substrate potential control circuit between the normal operation state and the standby state in accordance with the operation state,
  wherein the memory cell array control circuit, in response to the first control signal, switches the number of memory cells, for use in storage of data of 1 bit in the normal operation state, to m (m is a natural number) and switches the number of memory cells, for use in storage of data of 1 bit in the standby state, to n (n is a natural number larger than m),
  the substrate potential control circuit, in response to the second control signal, controls the substrate potential in the normal operation state to a first substrate potential, controls the substrate potential in the standby state to a second substrate potential (the second substrate potential>the first substrate potential), and controls the substrate potential during a burst refresh operation in the standby state to a third substrate potential (the third substrate potential<the second substrate potential).

8. The semiconductor storage device according to claim 7, further comprising a plurality of sense amplifiers that sense/amplify a potential difference appearing between predetermined first and second data lines of the plurality of data lines.

9. The semiconductor storage device according to claim 8, wherein the memory cell array control circuit performs switching so that in the standby state, data of 1 bit is stored by the memory cell connected to the first data line and the memory cell connected to the second data line.

10. The semiconductor storage device according to claim 8, wherein the memory cell array control circuit performs switching so that in the standby state, data of 1 bit is stored by the two memory cells connected to the first data line.

11. The semiconductor storage device according to claim 8, further comprising an arithmetic circuit that discriminates data, stored in the memory cell, from the output of the two sense amplifiers.

12. The semiconductor storage device according to claim 8, further comprising:
  a data line potential control circuit that controls a data line potential serving as an amplitude range of the data line; and
  an equalization potential control circuit that controls an equalization potential for adjusting the potential of the data line,
  wherein the operation state switching circuit generates/outputs a third control signal that controls the data line potential control circuit in accordance with the normal operation state/the standby state and a fourth control signal that controls the equalization potential control circuit,
  the data line potential control circuit, in response to the third control signal, controls the data line potential in the normal operation state to a first data line potential and controls the data line potential in the standby state to a second data line potential (the second data line potential<the first data line potential), and
  the equalization potential control circuit, in response to the fourth control signal, controls the equalization potential in the normal operation state to a first equalization potential and controls the equalization potential in the standby state to a second equalization potential (the second equalization potential<the first equalization potential).

13. The semiconductor storage device according to claim 7, wherein the third substrate potential is substantially the same as the first substrate potential.

14. A semiconductor storage device comprising:
- a memory cell array that comprises a plurality of word lines and data lines intersecting with each other and a plurality of memory cells each provided at an intersection of the word line and the data line, the memory cell having a cell transistor formed on a well subjected to application of a predetermined substrate potential;
- a memory cell array control circuit that controls the memory cell array;
- a substrate potential control circuit that controls the substrate potential; and
- an operation state switching circuit that controls the memory cell array control circuit and the substrate potential control circuit in accordance with a normal operation state/a standby state,
- wherein when the operation state is switched from the normal operation state to the standby state, the operation state switching circuit controls the substrate potential control circuit to control the substrate potential from a first substrate potential to a second substrate potential (the second substrate potential>the first substrate potential) and thereafter controls the memory cell array control circuit to switch the number of memory cells, for use in storage of data of 1 bit, from m (m is a natural number) to n (n is a natural number larger than m), and
- when the operation state is switched from the standby state to the normal operation state, the operation state switching circuit controls the substrate potential control circuit to control the substrate potential from the second substrate potential to the first substrate potential and thereafter controls the memory cell array control circuit to switch the number of memory cells, for use in storage of data of 1 bit, from n to m.

15. The semiconductor storage device according to claim 14, further comprising a plurality of sense amplifiers that sense/amplify a potential difference appearing between predetermined first and second data lines of the plurality of data lines.

16. The semiconductor storage device according to claim 15, wherein when the operation state is switched from the normal operation state to the standby state, the operation state switching circuit controls the memory cell array control circuit to copy data, obtained by inverting data of n memory cells connected to the first data line, to n memory cells connected to the second data line, before controlling the substrate potential from the first substrate potential to the second substrate potential.

17. The semiconductor storage device according to claim 15, wherein when the operation state is switched from the normal operation state to the standby state, the operation state switching circuit controls the memory cell array control circuit to copy data of n memory cells, connected to the first data line, to other n memory cells connected to the first data line, before controlling the substrate potential from the first substrate potential to the second substrate potential.

18. The semiconductor storage device according to claim 15, further comprising an arithmetic circuit that discriminates data, stored in the memory cell, from the output of the two sense amplifiers.

19. The semiconductor storage device according to claim 14, wherein the operation state switching circuit controls the substrate potential control circuit to control the substrate potential from the second substrate potential to a third substrate potential (the third substrate potential<the second substrate potential) before executing a burst refresh operation in the standby state.

20. The semiconductor storage device according to claim 15, further comprising:
- a data line potential control circuit that controls a data line potential serving as an amplitude range of the data line; and
- an equalization potential control circuit that controls an equalization potential for adjusting the potential of the data line,
- wherein when the operation state is switched from the normal operation state to the standby state, at the same timing as switching from the first substrate potential to the second substrate potential, the operation state switching circuit controls the data line potential control circuit to control the data line potential from a first data line potential to a second data line potential (the second data line potential<the first data line potential) and, at the same time, controls the equalization potential control circuit to control the equalization potential from a first equalization potential to a second equalization potential (the second equalization potential<the first equalization potential), and
- when the operation state is switched from the standby state to the normal operation state, at the same timing as switching from the second substrate potential to the first substrate potential, the operation state switching circuit controls the data line potential control circuit to control the data line potential from the second data line potential to the first data line potential and thereafter controls the equalization potential control circuit to control the equalization potential from the second equalization potential to the first equalization potential.

* * * * *